United States Patent [19]

Derewonko et al.

[11] 4,267,520
[45] May 12, 1981

[54] HYBRID COMPONENT FOR VERY HIGH FREQUENCY AMPLIFICATION

[75] Inventors: Henri Derewonko; Michel Laviron; Joel Lepage, all of Paris, France

[73] Assignee: Thomson-CSF, Paris, France

[21] Appl. No.: 35,414

[22] Filed: May 2, 1979

[30] Foreign Application Priority Data

May 3, 1978 [FR] France ................................ 78 13092

[51] Int. Cl.³ .............................................. H03F 3/60
[52] U.S. Cl. ........................................ 330/286; 330/302
[58] Field of Search ................................. 330/286, 302

[56] References Cited

U.S. PATENT DOCUMENTS

| 3,384,832 | 5/1968 | Mayeur | 330/286 |
| 3,428,911 | 2/1969 | Hambleton | 330/286 |
| 3,710,272 | 1/1973 | Ayaki | 330/286 |
| 4,004,256 | 1/1977 | Duncan | 330/286 |

FOREIGN PATENT DOCUMENTS

| 2424107 | 11/1975 | Fed. Rep. of Germany . |
| 2122777 | 1/1972 | France . |
| 986672 | 3/1965 | United Kingdom . |
| 1292614 | 10/1972 | United Kingdom . |
| 1329002 | 9/1973 | United Kingdom . |
| 1336587 | 11/1973 | United Kingdom . |
| 1465410 | 2/1977 | United Kingdom . |

OTHER PUBLICATIONS

"Design Technique . . . Transistor", by Hewitt et al., The Radio & Electrical Engineer, vol. 46, No. 10, pp. 463-471, 10-76.

*Primary Examiner*—Harold A. Dixon
*Attorney, Agent, or Firm*—Oblon, Fisher, Spivak, McClelland & Maier

[57] ABSTRACT

A component of the "hybrid-circuit" type comprising an active component, such as a very-high-frequency field-effect transistor, and a sealed housing, intended for operating as an amplifier in a large frequency band, in the range from 1 to 20 Gc/s. In this hybrid component, are accomodated in the same housing, by using in particular the ceramic elements of the base situated on the periphery of an earth return aperture containing the active component, metallizations forming lines having distributed constants. Moreover, to obtain a low standing-wave ratio on these lines, lumped circuit elements are placed inside the housing in the closest vicinity of the active component.

8 Claims, 8 Drawing Figures

HYBRID COMPONENT FOR VERY HIGH FREQUENCY AMPLIFICATION

This invention relates to the production of an amplifier having a very low standing wave ratio at its input and output ends and a considerable, constant amplification gain in a predetermined frequency range exceeding 1 GHz. In addition, the amplifier comprising at least one active component, such as a field-effect transistor, has to be protected against atmospheric influences by a sealed housing.

Known amplifiers use an active component in a sealed housing, circuit elements comprising lines having distributed constants and passive components of the discrete type used uniquely for effecting the necessary decouplings between d.c biassing circuits and high-frequency circuits. These known amplifiers do not enable the low standing wave ratio to be obtained in a large frequency band, where the amplifier is connected between two transmission lines of normal impedances.

The production of a hybrid component comprising the bare active component and the various element of the amplification circuit on one and the same ceramic plate would involve numerous problems residing primarily in the formation of an earth plan on that surface of the plate opposite the circuit elements, in the drilling of the plate to provide access to the earth plan and in the production of a special housing for each hybrid circuit formed. An arrangement such as this would be complicated and expensive to produce.

The present invention aims to avoid the disadvantages of conventional amplifiers on the one hand and the difficulties and cost of producing a conventional hybrid component on the other hand to be avoided whilst, at the same time, ensuring excellent performance levels.

According to the invention, there is provided a hybrid component intended for amplification at very high frequency, comprising:

a metallic base intended for constituting an earth plan;

an insulating plate having a central aperture;

a bare active component accomodated in said central aperture and mounted on said metallic base;

first circuit elements of the type of line having distributed constants, mounted on said insulating plate;

second circuit elements having lumped constants, intended for adapting said lines having distributed constants to the input and/or output impedance of said bare active component, said second circuit components being mounted on said hybrid component in the vicinity of said bare active component.

The invention will be better understood and other features thereof will become apparent from the following description in conjunction with the accompanying drawings, wherein.

Figure 1B:
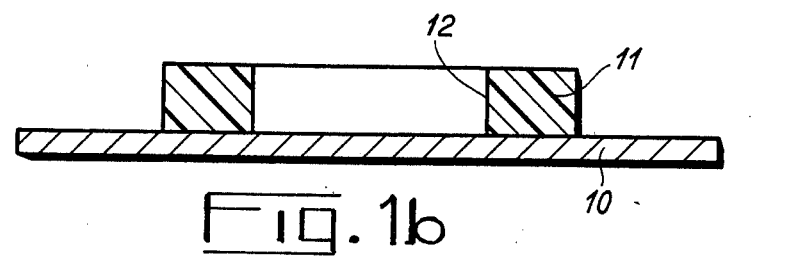
FIG. 1(a) is a plan view and FIG. 1(b) a section along a median plane AA on the plan (a) showing a known housing for an active very-high-frequency semi-conducting component.
Figure 1A:
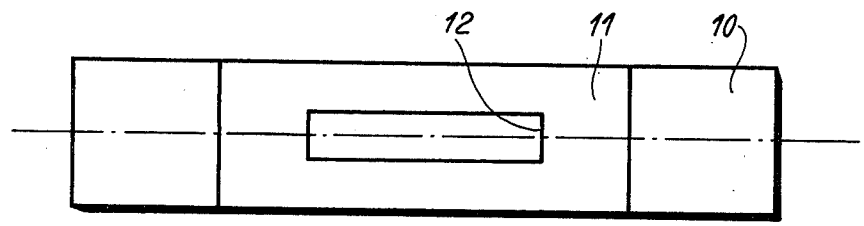

FIG. 1 shows a housing for a very-high-frequency (above 1 GHz) active component without its hermetic closure cap (not shown). A plan view, FIG. 1(a), shows a rectangular base 10 (length 16 mm, width 5 mm) of which the ends are designed to act as mechanical fixing lugs and, to this end, may be formed with holes. A rectangular ceramic plate 11 has been welded to the central part of this base, having the same width (5 mm) as but a shorter length than the base. This plate comprises a central rectangular opening 12 measuring approximately 5 mm × 1 mm. The cap (not shown), is formed by a ceramic plate of which the dimensions are ample for covering the central opening.

Figure 2:
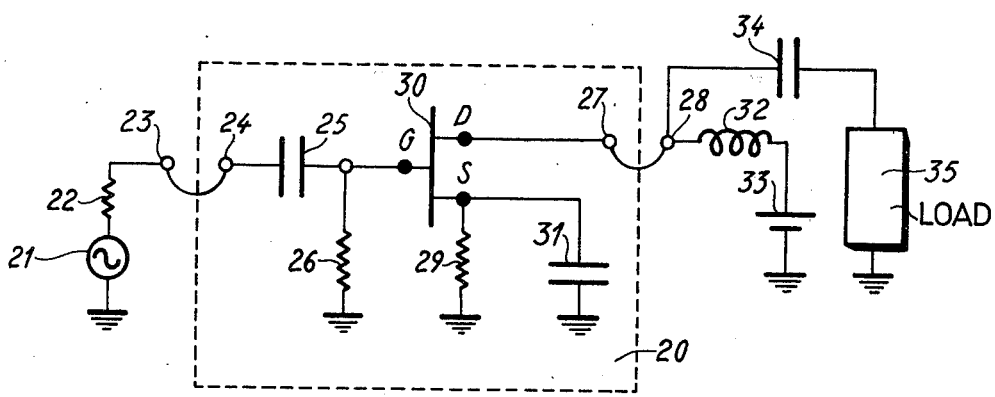
FIGS. 2 and 3 are explanatory circuit diagrams.

The circuit diagram shown as an example in FIG. 2 divides into three parts:

a first part, not included in the hybrid component according to the invention, comprising a high-frequency (for instance from 4 to 18 GHz) current generator 21 in series with a resistance 22, the symbol of the internal resistance of the generator, and a terminal 23 for connection to the hybrid circuit;

a second part, constituting the hybrid component 20, comprising a terminal 24, a capacitance 25, a resistance 26, a field-effect transistor 30 (gate G, source S and drain D), a resistance 29 which, together with a capacitance 31 connected in parallel between the source and earth, forms a self-biassing cell for the source in relation to earth and, finally, a terminal 27;

a third part, situated outside the hybrid circuit, comprising a terminal 28 connecting in parallel a d.c circuit branch (source 33 in series with a decoupling inductance 32) and a high-frequency current branch (capacitance 34 in series with a load 35), each of these branches being looped through earth.

Figure 3:
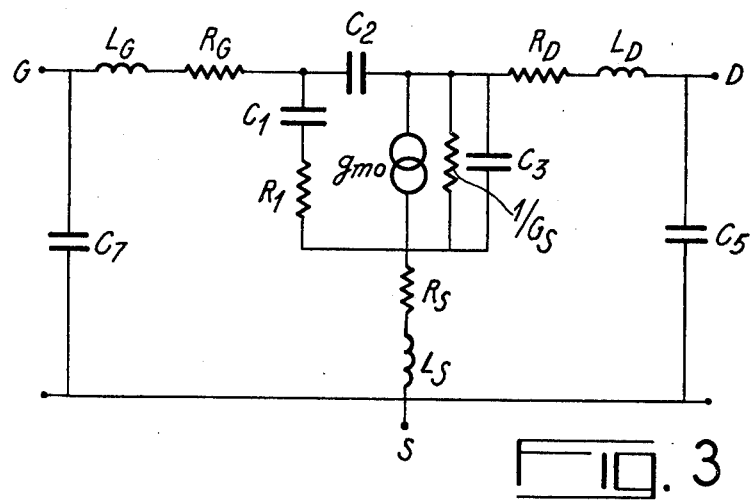

The equivalent circuit diagram of the transistor 30 is shown in FIG. 3. Its characteristics are shown in Table 1. Each column corresponds to a transistor differing from the others in the effective width of its gate, i.e the useful length of the gate electrode comprising several parallel fingers.

TABLE 1

| Width of G | 250μ | 400μ | 800μ | 1200μ | 1600μ | 3200μ |
|---|---|---|---|---|---|---|
| $L_S$ (nH) | 0.05 | 0.1 | 0.1 | 0.1 | 0.1 | 0.03 |
| $L_G$ (nH) | 0.1 | 0.2 | 0.1 | 0.05 | 0.05 | 0.1 |
| $L_D$ (nH) | 0.1 | 0.3 | 0.2 | 0.3 | 0.2 | 0.15 |
| $R_S$ (ohms) | 1 | 3 | 3 | 0.5 | 0.7 | 0.3 |
| $R_G$ (ohms) | 12 | 10 | 4 | 2 | 2 | 1.6 |
| $R_D$ (ohms) | 6 | 1 | 1 | 1 | 1 | 0.2 |
| $C_1$ (pF) | 0.25 | 0.6 | 2 | 2.8 | 3.4 | 6.4 |
| $C_2$ (pF) | 0.015 | 0.01 | 0.02 | 0.09 | 0.15 | 0.28 |
| $G_{mo}$ (mhos) | 28 | 37 | 115 | 149 | 216 | 405 |
| $G_S$ (mhos) | 2.2 | 2 | 5 | 5 | 5 | 14.4 |
| $\tau_t$ (ps) | 7 | 6 | 7 | 6 | 6 | 4.8 |
| $R_1$ (ohms) | — | .3 | 2.6 | 5.5 | 3 | 1.4 |
| $C_3$ (pF) | — | 0.1 | 0.15 | 0.15 | 0.25 | 0.56 |

Figure 4:
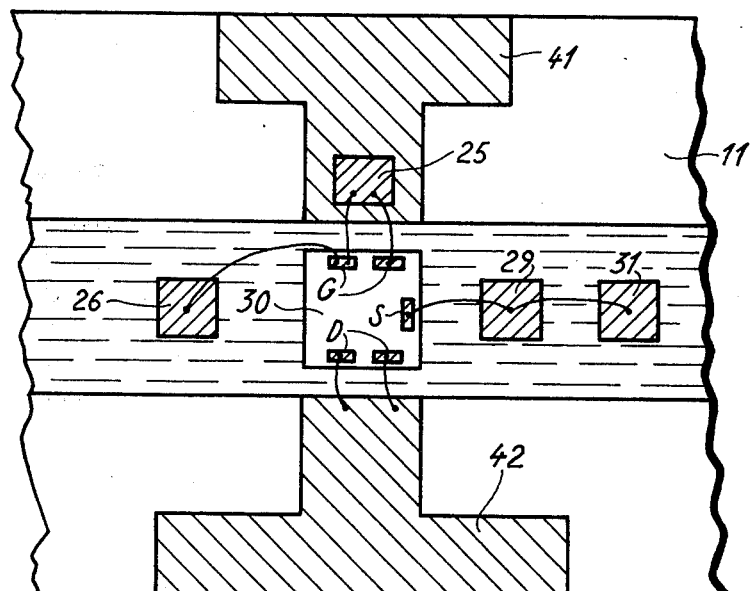
FIG. 4 is a plan view (partial) of a hybrid component according to the invention.

FIG. 4 is a plan view of a hybrid component according to the invention (with the cap removed) incorporating a field-effect transistor of which the characteristics are shown in Table 1. The elements of the diagram of FIG. 2 and the corresponding elements of the hybrid component shown in FIG. 4 have been denoted by the same reference numerals.

In the examples given in the following, it is assumed that the internal resistance 22 of the generator 21 is equal to 50 ohms. Similarly, the load 35 is assumed to be equivalent to a pure resistance of 50 ohms. The gate width of the transistor used is indicated for each example.

The example of embodiment of the invention illustrated in FIG. 4 contains lines with distributed constants 41 and 42 comprising metallisations for adaptation to the input and outputs circuits, i.e the gate input circuit and the drain output circuit. In this case, the gate width of the transistor is equal to 1600 microns. The insulating plate 11 is made of a ceramic having low dielectric losses at the service frequencies situated in the band from 4 to 18 GHz. The capacitances 25 and 31 identical in value (45 pF) are formed by the application of ceramic chips metallised on their two faces produced by the method normally used for dielectric ceramic capacitors. The resistances 26 and 29, of which the respective values are 1000 ohms and 4.6 ohms (1/$g_{mo}$) are formed by means silicon chips doped in the usual way and metallised on their two faces. In both cases, the capacitor or resistance plates have one metallised face which is welded to the base or to the metallisation. The connections are established by gold wires welded to the metallisations of the free faces of the plates of the respective components. These connections have to be as short as possible to ensure negligible inductance at the frequencies used. Accordingly, the components are positioned as close as possible to one another.

Figure 5:
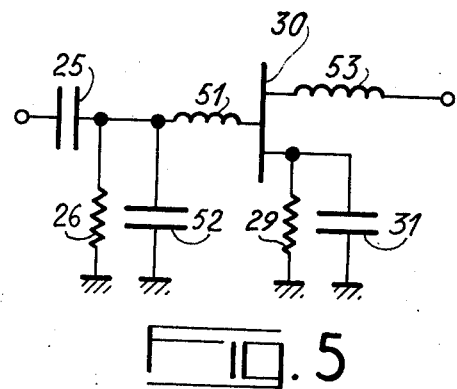
FIGS. 5, 6 and 7 are examples of equivalent circuit diagrams of embodiments of the invention.
Figure 6:
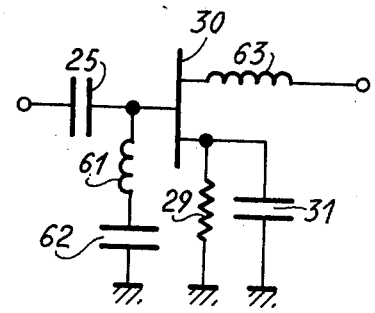
Figure 7:
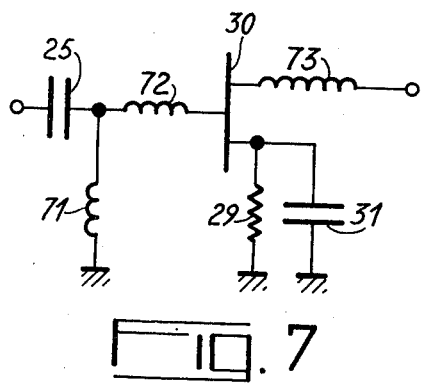

In the embodiments shown in FIGS. 5 to 7, the resistive and capacitive components are chips similar to those of the preceding example. However, the inductances are formed by simple loops of gold wire adjusted by calculation and/or experience.

FIG. 5 is the circuit diagram of an amplifier with a flat gain of 8 dB in the band from 4 to 8 GHz using a transistor according to Table 1 with a gate width of 800 microns and delivering a power of 200 mW (for example). The values of the components 25, 26 and 31 are the same as in the preceding example. By contrast, the resistance 29, a function of $g_{mo}$, has a value of 8.7 ohms. The inductances 51 and 53 have respective values of 0.5 and 1 nH and the capacitance 52 has a value of 0.5 pF.

The components 51 and 52 form a low-pass filter element.

FIG. 6 is the circuit diagram of an amplifier with a substantially flat gain of 6 to 7 dB in the frequency band from 5 to 13 GHz using a transistor according to Table 1 with a gate width of 300 microns and delivering a power of 50 mW (for example). The new components differing from those of the example shown in FIG. 4 are a capacitance 62 (optional) and inductances 61 (0.5 nH) and 63 (1 nH).

FIG. 7 is the circuit diagram of an amplifier with a substantially flat gain of 6 to 8 dB in the frequency band from 9 to 15 GHz or from 13 to 18 GHz using a transistor according to Table 1 with a gate width of 300 microns and delivering a power of 50 mW (for example). The new components differing from those of the example of FIG. 4 are the inductances 71 (0.5 nH), 72 (0.5 nH) and 73 (1 nH). So far as the resistance 29 is concerned, a value of approximately 30 ohms is obtained by interpolating the values of $g_{mo}$ for the gate values which comprise 300 microns.

Figure 8:
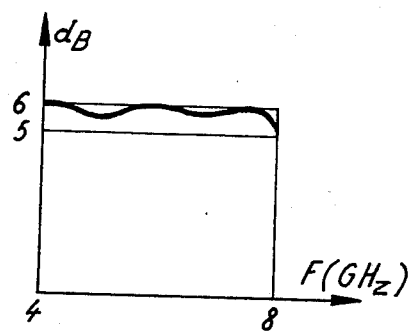
FIG. 8 is a gain graph.

FIG. 8 shows the gain curve as a function of the frequency F measured on the example of FIG. 4 between 4 and 8 GHz. It can be seen that the gain fluctuates between 5.5 and 6 dB over the major part of its path.

Greater flat-gain bands may be obtained by improving the cell elements of band-pass filters formed by the components placed at the input and output ends of the amplifier.

However a theoretical and practical limit is assigned to such an improvement when one intends to use bare active components exhibiting excellent performance but intrinsically high Q factors either at the input or at the output. A high Q means a high reflection coefficient when operating in a large frequency band and on a complex characteristic impedance as it is always the case at very high frequency. Therefore, whatever may be the circuit elements chosen for adapting the impedances at the input and output, the standing wave ratio will be high with such active components.

As a conclusion, it is convenient to choose, for amplifying on large bands, transistors having low Q factors as well at output as at input.

What we claim is:

1. A hybrid component of the type wherein a field-effect transistor is mounted in a sealed housing and is destined to operate as a high frequency (1–20 Gc/s) amplifier, by insertion between a h.f. supply and a load cooperating with a d.c. supply and means for decoupling the load from said d.c. supply, said hybrid component comprising:

a metallic base, said base constituting a ground plane;

an insulating plate including a central aperture therein, said plate being mounted onto said metallic base;

first and second metallized lines deposited onto said insulating plate, said metallized lines constituting lines with distributed constants, said first metallized line being coupled between said h.f. supply and an input of said hybrid component, said second metallized line being coupled between an output of said hybrid component and said load and said d.c. supply;

a bare field-effect transistor chip including a first large face having a source terminal, a gate terminal, and a drain terminal located thereon and a second large face opposite to said first face, said second large face being welded onto said metallic base inside said aperture of said insulating plate;

a gate input capacitor coupled between said first metallized line and said gate terminal, said gate input capacitor being formed from a ceramic chip metallized on two of its faces, said ceramic chip being welded onto said first metallized line;

a first resistor coupled between said gate terminal and said metallic base, said first resistor being formed from a silicon chip metallized on two of its faces, said first resistor being welded onto said metallic base;

a self-biasing cell coupled between said source terminal and said metallic base, said self-biasing cell including a second silicon chip resistor coupled in parallel with a ceramic chip biasing capacitor, said second resistor and said biasing capacitor being welded onto said metallic base;

an output conductor coupling said drain terminal to said second metallized line; and an hermetic closure cap covering said central aperture in said insulating plate.

2. A hybrid component as recited in claim 1, wherein:

said gate input capacitor has a value of 45 pF;

said first resistor has a value of 1000 ohms;

said field-effect transistor has a gate width of 1600 microns;

said second resistor has a resistance lying in the range of 4 to 5 ohms; and said biasing capacitor has a value of 45 pF.

3. A hybrid component as recited in claim 1, which further comprises:

a first inductor coupled between said drain terminal and said output conductor;

a second inductor coupled between said gate terminal and the combination of said gate input capacitor and said first resistor; and a third capacitor coupled in parallel with said first resistor;

whereby said second inductor and said third capacitor form a low pass filter element.

4. A hybrid component as recited in claim 3, wherein:
said field-effect transistor has a gate width of 800 microns;
said second resistor has a value lying in the range of 8 to 9 ohms;
said first inductor has a value of 1 nH;
said second inductor has a value of 0.5 nH; and
said third capacitor has a value of 0.5 pF.

5. A hybrid component as recited in claim 1, which further comprises:
a first inductor coupled between said drain terminal and said output conductor; and
a series circuit coupled between said gate terminal and said metallic base, said series circuit including a second inductor coupled in series with a third capacitor.

6. A hybrid component as recited in claim 5, wherein:
said first inductor has a value of 1 nH; and
said second inductor has a value of 0.5 nH.

7. A hybrid component of the type wherein a field-effect transistor is mounted in a sealed housing and is destined to operate as a high frequency (1–20 Gc/s) amplifier, by insertion between a h.f. supply and a load cooperating with a d.c. supply and means for decoupling the load from said d.c. supply, said hybrid component comprising:

a metallic base, said base constituting a ground plane;

an insulating plate including a central aperture therein, said plate being mounted onto said metallic base;

first and second metallized lines deposited onto said insulating plate, said metallized line constituting lines with distributed constants, said first metallized line being coupled between said h.f. supply and an input of said hybrid component, said second metallized line being coupled between an output of said hybrid component and said load and said d.c. supply;

a base field-effect transistor chip including a first large face having a source terminal, a gate terminal, and a drain terminal located thereon, and a second large face opposite to said first face, said second large face being welded onto said metallic base inside said aperture of said insulating plate;

a first series inductor having first and second terminals, said first terminal being coupled to said gate terminal;

a gate input capacitor coupled between said first metallized line and said second terminal of said first inductor, said gate input capacitor being formed from a ceramic chip metallized on two of its faces, said ceramic chip being welded onto said first metallized line;

a leakage inductor coupled between said second terminal of said first inductor and said metallic base;

a self-biasing cell coupled between said source terminal and said metallic base, said self-biasing cell including a resistor coupled in parallel with a ceramic chip biasing capacitor, said resistor being formed from a silicon chip metallized on two of its faces, said resistor and said biasing capacitor being welded onto said metallic base;

a second series inductor coupled between said drain terminal and said second metallized line; and an hermetic closure cap covering said central aperture in said insulating plate.

8. A hybrid component as recited in claim 7, wherein:
said first series inductor has a value of 0.5 nH;
said gate input capacitor has a value of 45 pF;
said leakage inductor has a value of 0.5 nH;
said resistor has a value equal to the reciprocal of the transconductance of said field-effect transistor; and
said second series inductor has a value of 1 nH.

* * * * *